(12) United States Patent
Li

(10) Patent No.: US 6,637,013 B1
(45) Date of Patent: Oct. 21, 2003

(54) METHOD AND SYSTEM FOR AUTOMATING DESIGN RULE CHECK ERROR CORRECTION IN A CAD ENVIRONMENT

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/589,574

(22) Filed: Jun. 7, 2000

(51) Int. Cl.[7] ............................................. G06F 17/50
(52) U.S. Cl. ............................................. 716/5; 716/11
(58) Field of Search .............................. 716/1, 2, 4, 5, 716/11, 8

(56) References Cited

U.S. PATENT DOCUMENTS

| | | | | |
|---|---|---|---|---|
| 5,497,334 A | * | 3/1996 | Russell et al. | 716/5 |
| 5,787,006 A | * | 7/1998 | Chevallier et al. | 364/488 |
| 6,009,251 A | * | 12/1999 | Ho et al. | 716/5 |
| 6,011,911 A | * | 1/2000 | Ho et al. | 716/5 |
| 6,063,132 A | * | 5/2000 | DeCamp et al. | 716/5 |
| 6,341,366 B1 | * | 1/2002 | Wang et al. | 716/11 |

OTHER PUBLICATIONS

Barnes, "SKILL : A CAD System Extension Language," 1990 27th ACM/IEEE Design Automation Conference, pp. 266–271.*

Karam et al., "High Level CAD Melds Microsystems with Foundries," 1996 European Design and Test Conference, pp. 442–447.*

Luo et al., "An Edge–Endpoint–Based Configurable Hardware Architecture for VLSI CAD Layout Design Rule Checking," 1999 7th Annual IEEE Symposium on Field–Programmable Custom Computing Machines, pp. 158–167.*

* cited by examiner

Primary Examiner—Leigh M. Garbowski
(74) Attorney, Agent, or Firm—Thelen Reid & Priest, LLP; David B. Ritchie

(57) ABSTRACT

In a computer-aided design environment, a technique for automating design rule check error corrections in a CAD environment contemplates the use of an automation program, such as a SKILL program, to automatically and continuously run a design rule check utility program to generate intermediate results which are processed by the automation program and then supplied back to the design rule check utility program again for execution. The whole process is repeated, in an iterative manner, as many times as needed until a final result is achieved.

7 Claims, 3 Drawing Sheets

METHOD AND SYSTEM FOR AUTOMATING DESIGN RULE CHECK ERROR CORRECTION IN A CAD ENVIRONMENT

BACKGROUND OF THE INVENTION

1. Field of the Invention

This invention relates to Computer Aided Design (CAD) tools. More particularly, the present invention relates to a method and system for automating design rule check error corrections in a CAD environment.

2. Background Art

Computer aided design tools are utilized on a wide scale in many research and development environments to design electrical, mechanical, chemical and/or other types of products. In the field of semiconductor design, such CAD tools help designers implement complex circuit architectures into semiconductor products. Such CAD tools are used for system level design, custom integrated circuit design tools, deep submicron design, logic design and verification, printed circuit board (PCB), package and interconnect design. A popular set of CAD tools, referred to as the Opus CAD design environment, is commercially available from Cadence Design Systems, Inc. of San Jose, Calif. In the Opus CAD design environment, the physical design of an integrated circuit depends on a set of design rules. The design rules are often determined inherently from the type of semiconductor fabrication technology, e.g., CMOS, NMOS, PMOS, etc. which is being utilized to implement the integrated circuit. Design rules typically define physical parameters and relationships such as minimum area, diagonal width, diagonal space, etc., of a physical entity in an integrated circuit. Throughout the development and design of an integrated circuit, such design rules are referenced directly and indirectly by both commercial CAD design tools and custom design tools developed in-house by the designers. Such custom design tools may be used to create designs, check designs for rule violations, or to preprocess or post process a design to or from other design tools. A subset of all of the design rules in the Opus CAD design environment is stored in an internal file referred to as a technical file or "Tech" file. The Tech file is used internally by the Opus CAD tool products.

In an Opus CAD design environment, custom designed CAD tools may be written in the SKILL programming language. The SKILL programming language is a high level language with primitives and operators specifically designed for CAD related tasks and well known to those of ordinary skill in the art. Both commercial and custom-designed CAD programs may be written in the SKILL programming language and are designed to perform specific tasks to assist with the design of an integrated circuit. Specifically, a SKILL program may be used to find the areas that have not been covered by a specific metal. Then it fills those areas with the specific metal according to the design rule. Finally, it finds all the intersecting areas among the filled metal and the consecutive grounded metals. Using metal 2 as an example, it first finds the areas that have not been covered by metal 2. Then it fills metal 2 in those areas according to the design rule. Finally, it finds all the intersecting areas among the filled metal 2 and grounded metal 1 and metal 3, so that the program can drop vias to connect the filled metal 2 to metal 1 ground or metal 3 ground.

DIVA, a design verification utility product commercially available from Cadence Design Systems, Inc., of San Jose, Calif., is commonly used to verify a physical design or derive the result of certain logical operations among geometries on the same or different layers of integrated circuit design. In design flow development, it is very common to write a DIVA rules file to get result geometries from some logical operations on geometries of certain layers. For example, to fill a via 5 one finds all of the cross areas of metal 5 (m5) vss and metal 6 (m6) vss as possible in the result areas and connects them together by filling these areas. In a simple case as mentioned above to fill via 5, a SKILL program can be written to run the DIVA utility to find all the cross areas between m5 vss and m6 vss, derive those areas to a supplement layer called a "hilite" drawing, and use the SKILL program to fill via 5 in all hilite drawing geometries.

Often, in more complex cases, however, there will be some side effects caused by use of the DIVA utility. For example, if the result contains some Design Rule Check (DRC) errors, such errors must be fixed before the flow of the design process continues. Each time the design changes, the design flow has to run once again. Accordingly, it is inconvenient to break the design flow in the middle and have a layout designer fix the DRC errors at that point. Given the large number of designs that need to be run throughout a design flow, a manual fix approach becomes impractical.

Accordingly, a need exists for a technique to automate design rule check error corrections in a CAD environment.

A further need exists for a technique to automate design rule check error corrections in a CAD environment which can be used in an iterative manner until a predetermined level of iterations has been achieved or no more DRC errors are found.

SUMMARY OF THE INVENTION

A technique for automating design rule check (DRC) error corrections in a CAD environment contemplates the use of an automation program to automatically and continuously run a design rule check utility program to generate intermediate results which are processed by the automation program and then supplied back to the design rule check utility program again for execution. The whole process is repeated, in an iterative manner, as many times as needed until a final result is achieved.

In one aspect of the invention, in a computer-aided design environment, a method for eliminating design rule check errors detected by a design verification tool in a set of design data comprises: (a) processing a set of design data with the design verification tool to produce verification results, and attaching a specific property to each type of error detected; (b) determining if the verification results contain an error; (c) if an error is detected in the verification results, modifying the design data in accordance with the attached specific property of the verification results; and (d) repeating steps (a) through (c) sequentially until no errors are found in the verification results or a preset repeat count or time limit has been reached. In one embodiment, if no errors are detected in the verification results the error free design data is processed. In another embodiment, step (a) of processing a set of design data with the design verification tool further comprises: (a.1) creating a design verification tool rules file designed to be able to attach a specific property to each type of error detected and (a.2) processing the design data with the design verification tool using the tool rules file. In another embodiment, step (c) of modifying the design data further comprises augmenting the design data and creating a design verification tool rules file for the augmented design data.

In another aspect of the invention, in a computer-aided design environment, a method for eliminating design rule check errors detected by a design verification tool in a set of design data, including geometric data describing a design, comprises: (a) creating a design verification tool rules file which is designed to be able to attach a specific property to each type of error detected; (b) processing a set of design data with the design verification tool to produce verification results; (c) determining if the verification results contain an error; (d) if an error is detected in the verification results, creating supplemental geometries depending on the attached specific property to resolve a detected error; (e) creating a supplemental design verification tool rules file for the supplemental geometries; and (f) repeating steps (b) through (e) until no errors are found in the design verification results or a preset repeat count or time limit is reached. In one embodiment, if no errors are detected in the verification results then the error free design data is processed.

In another aspect of the invention, a computer program product for use with a computer system, the computer system capable of executing computer-aided design programs, comprises a computer usable medium having program code embodied in the medium, the program code comprising: (a) program code configured to process a set of design data to produce verification results; (b) program code configured to determine if the verification results contain an error; (c) program code configured to modify the design data if an error is detected in the verification results; and (d) program code configured to process any modified design data until no errors are found in the respective design verification results or it reaches a preset repeat count or time limit.

In yet another aspect of the invention, a computer program product for use with a computer system, the computer system capable of executing computer-aided design programs, comprises a computer usable medium having program code embodied in the medium, the program code comprising: (a) program code configured to create a design verification tool rules file which is designed to attach a specific property to each type of detected error; (b) program code configured to process a set of design data with the design verification tool to produce verification results; (c) program code configured to determine if the design verification results contain an error; (d) program code configured to create supplemental geometries to resolve a detected error responsive to the specific property if an error is detected in the verification results; (e) program code configured to create a supplemental verification tool rules file for the supplemental geometries; and (f) program code configured to process any modified design data until no errors are found in the respective verification results or a preset repeat count or time limit is reached.

BRIEF DESCRIPTION OF THE DRAWINGS

The above and other features, objects and advantages of the invention will be better understood by referring to the following detailed description in conjunction with the accompanying drawing in which.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 1:
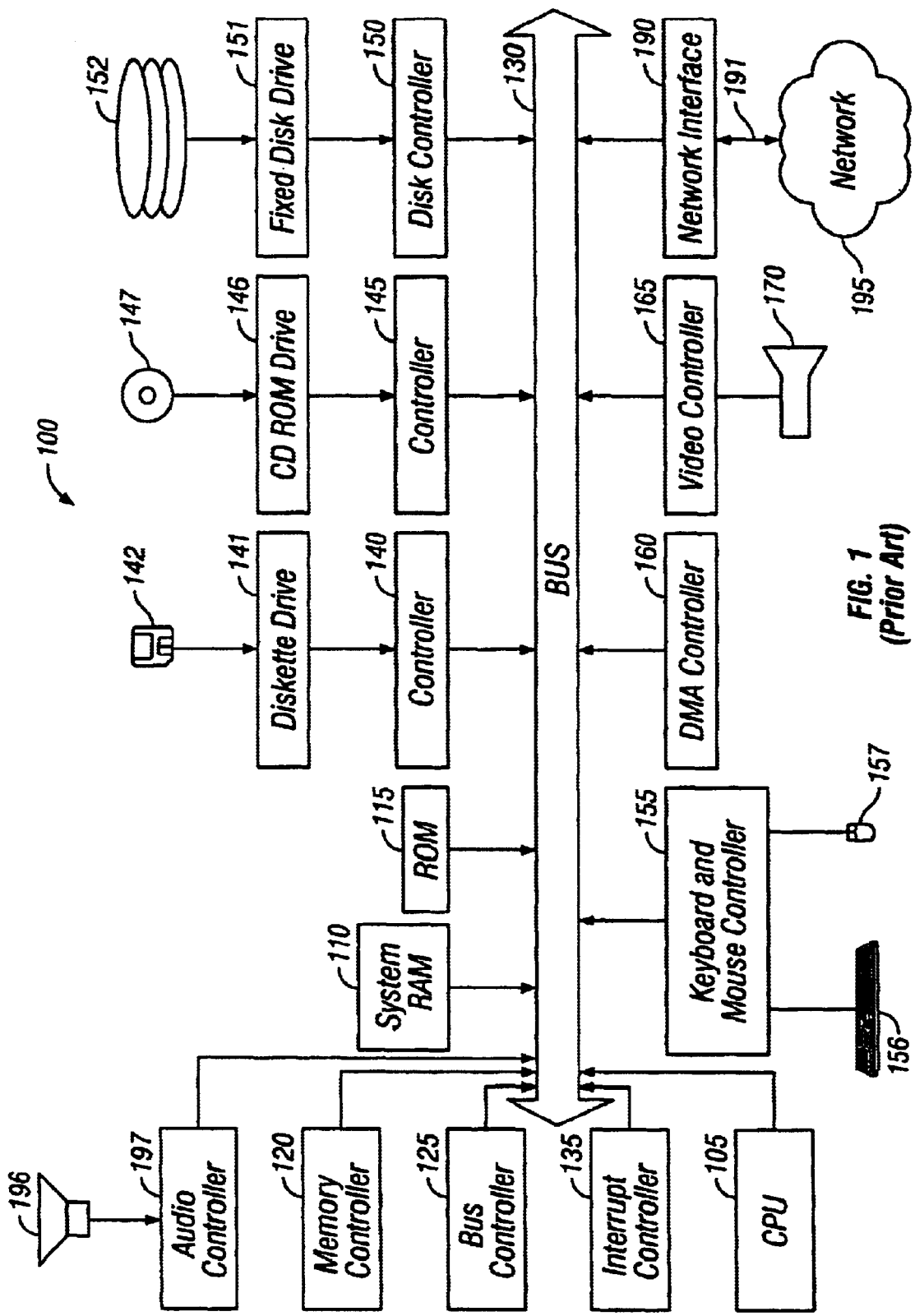
FIG. 1 is a block diagram of a computer system suitable for use with the present invention.

FIG. 1 illustrates the system architecture for a computer system 100 such as an IBM PS/2®, on which the invention may be implemented. The exemplary computer system of FIG. 1 is for descriptive purposes only. Although the description may refer to terms commonly used in describing particular computer systems, such as in IBM PS/2 computer, the description and concepts equally apply to other systems, such as a Sun SparcStation 5 workstation, commercially available from Sun Microsystems of Palo Alto, Calif., including systems having architectures dissimilar to that of FIG. 1.

Computer system 100 includes a central processing unit (CPU) 105, which may be implemented with a conventional microprocessor, a random access memory (RAM) 110 for temporary storage of information, and a read only memory (ROM) 115 for permanent storage of information. A memory controller 120 is provided for controlling RAM 110. A bus 130 interconnects the components of computer system 100. A bus controller 125 is provided for controlling bus 130. An interrupt controller 135 is used for receiving and processing various interrupt signals from the system components.

Mass storage may be provided by diskette 142, CD ROM 147, or hard drive 152. Data and software may be exchanged with computer system 100 via removable media such as diskette 142 and CD ROM 147. Diskette 142 is insertable into diskette drive 141 which is, in turn, connected to bus 30 by a controller 140. Similarly, CD ROM 147 is insertable into CD ROM drive 146 which is, in turn, connected to bus 130 by controller 145. Hard disk 152 is part of a fixed disk drive 151 which is connected to bus 130 by controller 150.

User input to computer system 100 may be provided by a number of devices. For example, a keyboard 156 and mouse 157 are connected to bus 130 by controller 155. An audio transducer 196, which may act as both a microphone and a speaker, is connected to bus 130 by audio controller 197, as illustrated. It will be obvious to those reasonably skilled in the art that other input devices, such as a pen and/or tabloid may be connected to bus 130 and an appropriate controller and software, as required. DMA controller 160 is provided for performing direct memory access to RAM 110. A visual display is generated by video controller 165 which controls video display 170. Computer system 100 also includes a communications adapter 190 which allows the system to be interconnected to a local area network (LAN) or a wide area network (WAN), schematically illustrated by bus 191 and network 195.

Operation of computer system 100 is generally controlled and coordinated by operating system software, such as the Solaris® operating system, commercially available from Sun Microsystems, the UNIX® operating system, commercially available from The Open Group, Cambridge, Mass., the OS/2® operating system, commercially available from International Business Machines Corporation, Boca Raton, Fla., or the Windows NT® operating system, commercially available from MicroSoft Corp., Redmond, Wash.

The operating system controls allocation of system resources and performs tasks such as processing scheduling, memory management, networking, and I/O services, among things. In particular, an operating system resident in system memory and running on CPU 105 coordinates the operation of the other elements of computer system 100.

CAD Environment

Figure 2:
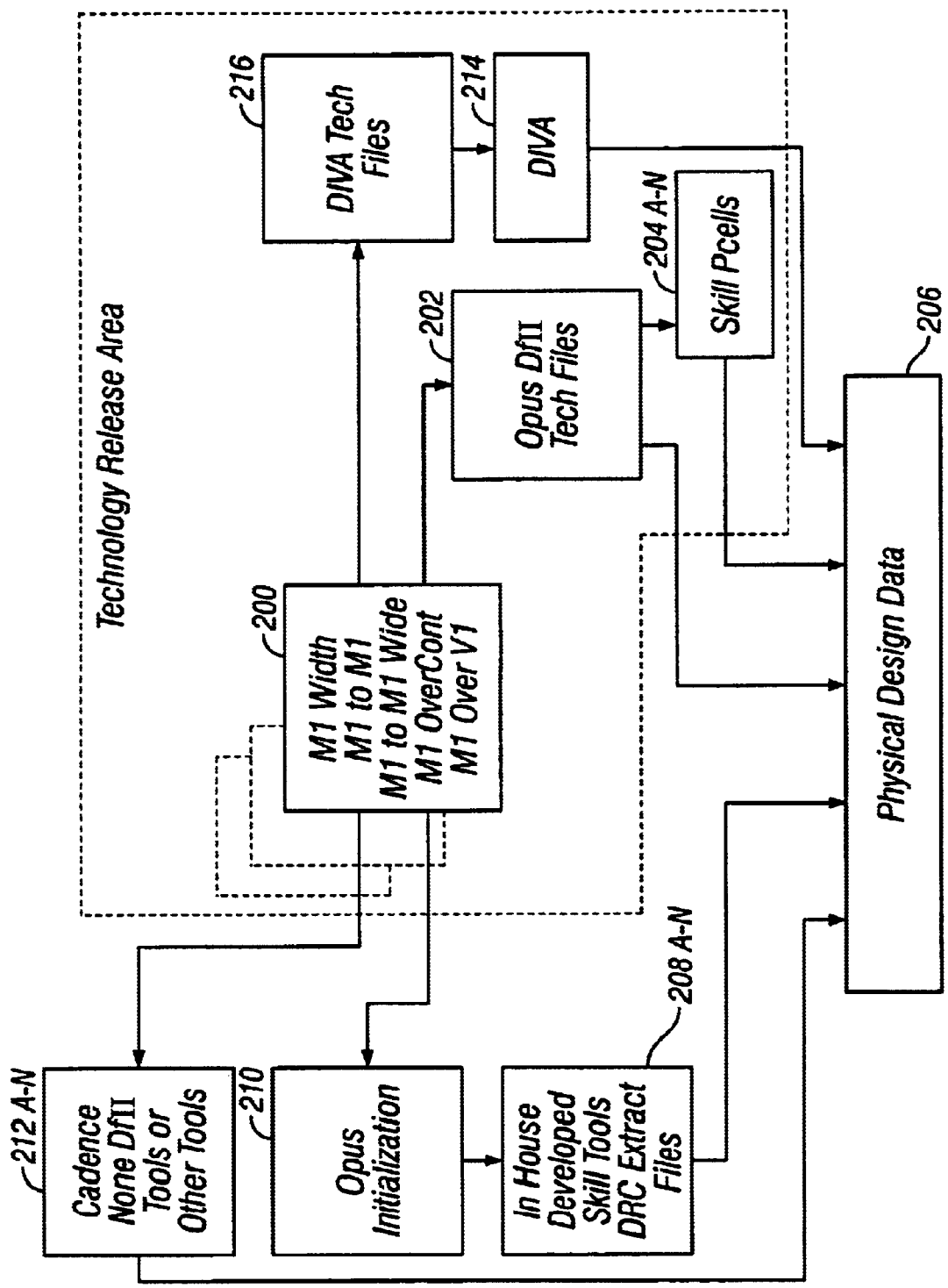
FIG. 2 is a conceptual block diagram of a CAD environment in which the present invention may be utilized.

FIG. 2 is a conceptual block diagram of a CAD environment in which the present invention is implemented. Specifically, the CAD environment comprises a global design rule definition file 200, a technology file 202, one or more programmable cells 204A–N, a physical design database 206, one or more custom CAD applications 208A–N, initialization programs 210 and other miscellaneous, non-native design applications 212A–N. Also shown is a verification tool 214 and verification tool rules file 216. The elements of the CAD environment illustrated in FIG. 2 collectively enable designers to physically model and design products, such as integrated circuits. Not all of the elements of the CAD environment described herein are necessary for the implementation of the present invention as will be apparent to those of ordinary skill in the art.

One or more of the elements within the CAD environment may be designed and/or operate according to the native language of the commercial CAD product environment, such as the Opus CAD environment, as in the illustrative embodiment. Many programs and entities within the Opus CAD environment are native to the SKILL programming language. The SKILL language is a high level programming language containing operators and primitives which are useful for designing CAD tools and applications. SKILL is the native language of most Opus tools including DIVA, the on line verification tool of Opus, commercially available from Cadence Design Systems, Inc. SKILL is used to develop custom CAD tools inside the Opus CAD environment, by Cadence products internally, and outside the Opus CAD design environment by designers. If a CAD tool is a native SKILL tool, variables can be passed directly through the tool interface. If a tool is a non-native SKILL tool, variables can not be accepted directly through the tool interface. Instead, a translation entity, as well known to those of ordinary skill in the art, must be used to format the variables into the language of the non-native CAD tool.

Technology File

The Technology file, referred to in the Cadence CAD design environment as the "Opus dfII technology file," and referred to herein as "technology file", contains design technology information, including part of the design rules. The Opus dfII technology file is compiled to bind to each design library and is used by Opus internal tools to set certain default values to ensure that the circuit geometries are created correctly.

The Technology file for the Opus environment also contains display information, layer definition, and cellView definitions such as layout, schematic or symbol data. Such information is needed either to represent the design on the screen or for some simulation purposes and is typically unrelated to design rules.

Verification Tools

Verification tools, such as DIVA, commercially available from Cadence Design Systems, Inc. of San Jose, Calif. and Calibre, commercially available from Mentor Graphics, Inc. of Wilsonville, Oreg., use their DRC rules files as input to verify if a physical design meets each of the design rules.

The DIVA product commercially available from Cadence Design Systems, Inc., may be used to verify a physical design or derive the result of certain logical operations among geometries on the same or different layers of an integrated circuit design. In design flow development, it is common to write a DIVA rules file 216 to get resultant geometries from some logical operations on geometries of certain layers.

CAD Tools

CAD tools typically perform a specific function related to a design. Such tools can be written in the native CAD design environment language, e.g. SKILL, or in a non-native language.

Physical Design Database

The physical design database 206 stores the data which represents the physical characteristics of the designed entity, e.g. the integrated circuit or a portion thereof. The physical design data in database 206 is organized into one or more libraries. Each library, in turn, may contain one or more cells. Each cell, in turn, may contain one or more views. The physical design is known as a layout cellView and serves as the atomic element from which a designer works on a design. Each library within database 206 may have a special technology file associated therewith. Alternatively, several libraries may share the same technology file. Database 206 may be implemented with any number of commercially available database products. The structure and function of physical design database 206 is well within the scope of those of ordinary skill in the art and will not be described in greater detail herein.

Process Description

Figure 3:
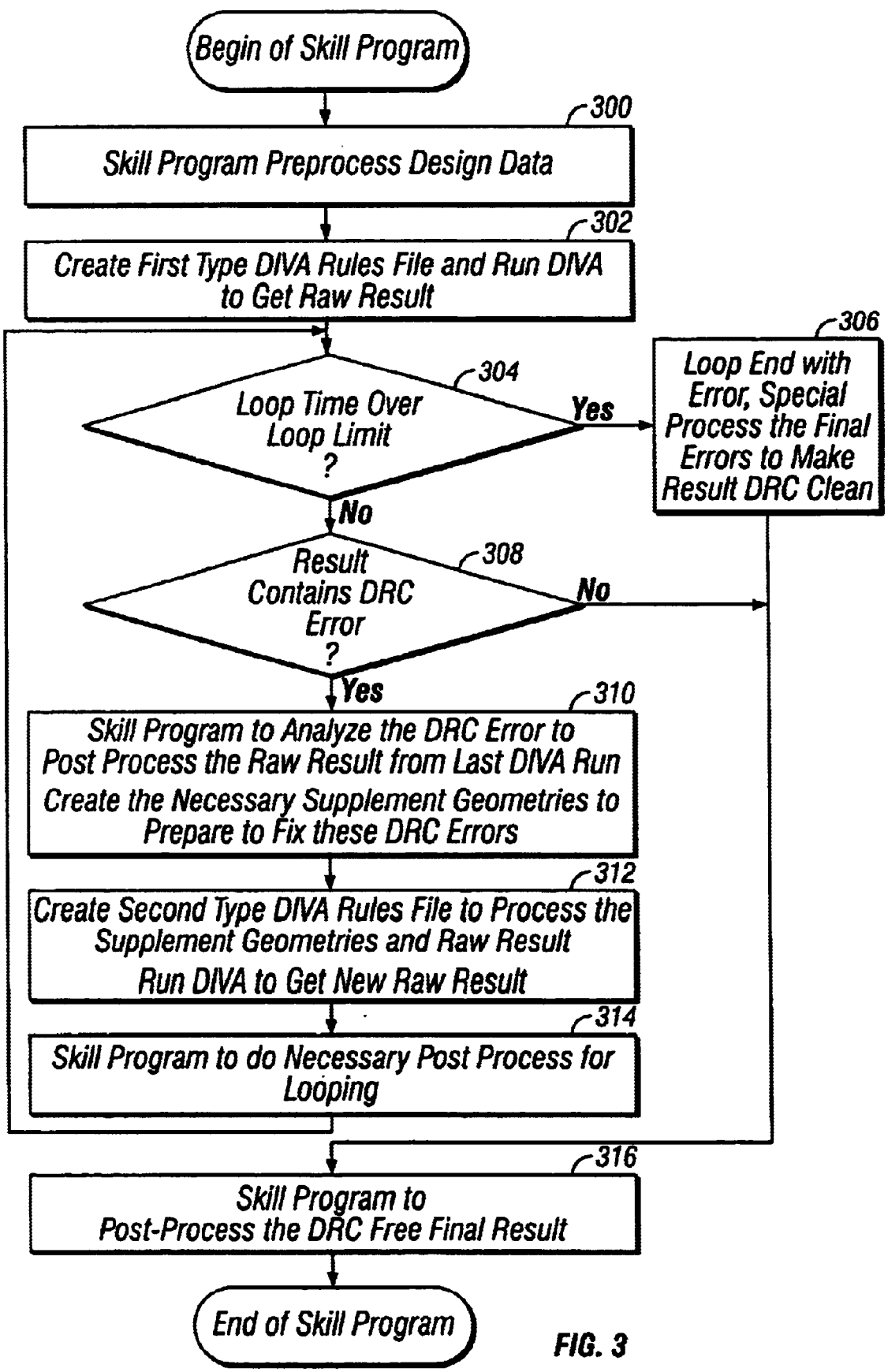
FIG. 3 is a flowchart illustrating a process for automating design rule check error corrections in accordance with the present invention.

Referring to FIG. 3, a process of an exemplary SKILL file embodying the inventive method of the present invention. Specifically, the SKILL program preprocesses the design data from the physical design database, as illustrated at block 300. Next, an initial DIVA rules file is created and executed to obtain a preliminary set of results, as illustrated at block 303. A sample program is shown as follows:

```
out_file = outfile(tcfile)
if(!out_file then
    printf("\nERROR: Unable to open file %s.\n" tcfile)
    return(nil)
)
fprintf(out_file "drcExtractRules(\n")
fprintf(out_file " m2 = geomOr(\"%s\")\n" layer)
fprintf(out_file " boundary =geomOr(\"hilite\")\n")
fprintf(out_file " om2 = geomSize(m2 %f)\n" space)
fprintf(out_file " mom2 = geomAnd(om2 boundary)\n")
fprintf(out_file " m2b = geomSize(m2 -%f)\n" M2Wide/2-0.001)
fprintf(out_file " m2b = geomSize(m2b %f)\n" M2Wide/2-0.001)
fprintf(out_file " om2b = geomSize(m2b %f)\n" M2ToM2Wide)
fprintf(out_file " mom2b = geomAnd(om2b boundary)\n")
fprintf(out_file " mom2 = geomOr(mom2 mom2b)\n")
fprintf(out_file " a = geomAndNot(boundary mom2)\n")
fprintf(out_file " c = geomSize(a -%f)\n" width/2)
fprintf(out_file " d = geomSize(c %f)\n" width/2)
fprintf(out_file " drc(d width < %f\"MinWidth\")\n" width)
fprintf(out_file " drc(d sep < %f\"MinSpace\")\n" space)
fprintf(out_file " drc(d notch < %f\"MinSpace\")\n" space)
fprintf(out_file " drc(d area < %f\"MinArea\")\n" M2MinArea)
fprintf(out_file " saveDerived(d (\"y5\" \"drawing\"))\n")
fprintf(out_file ")\n")
close(out_file)
tcLoadTechFile(cv~>lib tcfile)
ivDRC(
    ?cell cv
    ?set "drc"
    ?full t
)
error = nil
foreach(1pp cv~>1pps
    if(1pp~>layerName =="marker" && 1pp~>purpose =="error" then
        printf("marker = %L\n" length(1pp~>shapes))
        error = t
    )
)
```

The above program uses the supplemental geometries on the "hilite" layer to get the fill metal 2 boundary. They should be at least away from the existing metal 2 by M2ToM2 or M2ToM2Wide depending on the if the existing metal is regular or relatively wide metal respectively. In the same rules file, it checks to see if there is any DRC violation among those resultant geometries before deriving the "y5" layer. The program then sets a flag "error" to indicate if there is any error as an entry condition of the fix error loop.

The following program is the loop to fix the DRC errors, if they are detected. The program processes the result depending on the seeded property drcWhy.

```
error_ct = 0
while(error && error_ct < 10
   printf("DRC count = %d\n" error_ct)
   error_ct++
   FixDrcError(cv layer list("y5" "drawing") list("y6" "drawing"))
   out_file = outfile(tcfile)
   if(!out_file then
      printf("\nERROR: Unable to open file %s.\n" tcfile)
      return(nil)
   )
   fprintf(out_file " drcExtractRules(\n")
   fprintf(out_file " d = geomOr(\"%s\")\n" "y5")
   fprintf(out_file " y6 = geomOr(\"%s\")\n" "y6")
   fprintf(out_file " a = geomAndNot(d y6)\n")
   fprintf(out_file " c =geomSize(a -%f)\n" width/2)
   fprintf(out_file " d =geomSize(c %f)\n" width/2)
   fprintf(out_file " drc(d width < %f\"MinWidth\")\n" width)
   fprintf(out_file " drc(d sep < %f \"MinSpace\")\n" space)
   fprintf(out_file " drc(d notch < %f \"MinSpace\")\n" space)
   fprintf(out_file " drc(d area < %f \"MinArea\")\n" M2MinArea)
   fprintf(out_file " saveDerived(d (\"y7\" \"drawing\"))\n")
   fprintf(out_file " )\n")
   close(out_file)
   tcLoadTechFile(cv~>lib tcfile)
      ivDRC(
      ?cell cv
      ?set "drc"
      ?full t
   )
   foreach(1pp cv~>1pps
      if(1pp~>layerName =="y5" then
         DeleteObjectList(1pp~>shapes)
      )
   )
   foreach(1pp cv~>1pps
      if(1pp~>layerName =="y7" then
         foreach(sp 1pp~>shapes
            sp~>1pp = list("y5" "drawing")
         )
      )
   )
   error = nil
   foreach(1pp cv~>1pps
      if(1pp~>layerName =="marker" && 1pp~>purpose =="error" then
         printf("marker = %L\n" length(1pp~>shapes))
         if(length(1pp~>shapes) > 0 then
            error = t
         )
      )
   )
)
procedure(FixDrcError(@optional cv ck_lay wk_lay create_lay)
   prog((1pp sp drc_why line_1 x_1 y_1 line1 line2 y1 y2 center
m_line x1
      x2 ml obj_1 m_width m_space)
........
      foreach(1pp cv~>1pps
         if(1pp~>layerName =="marker" && 1pp~>purpose =="error" then
            foreach(sp 1pp~>shapes
               drc_why = car(parseString(sp~>drcWhy))
               case(drc_why
                  ("MinArea"
                     DeleteMinAreaShape(cv sp wk_lay)
                  )
                  (t
                     line_1 = GetPolygonLines(sp)
                     x_1 = car(line_1)
                     y_1 = cadr(line_1)
                     if(length(x_1) == 2 then
```

-continued

```
                        line1 = car(x_1)
                        line2 = cadr(x_1)
                        y1 = yCoord(car(line1))
                        y2 = yCoord(car(line2))
                        if(y1 > y2 then
                           line1 = cadr(x_1)
                           line2 = car(x_1)
                        )
                        center = (y1 + y2)/2
                        center = float(fix(center*100))/100
                        m_line = FindXOverlapLine(cv line1 wk_lay)
                        if(m_line then
                           foreach(ml m_line
                              MakeXDeleteBox(cv ml center line1 m_space
                                 create_lay "b")
                           )
                        )
                        m_line = FindXOverlapLine(cv line2 wk_lay)
                        if(m_line then
                           foreach(ml m_line
                              MakeXDeleteBox(cv ml center line2 m_space
                                 create_lay "t")
                           )
                        )
                     else
........
                     )
                  )
               )
            )
         )
      )
)
```

FixDrcError is a procedure to generate necessary supplement geometries on layer y6, so that the following DIVA rules file can instruct DIVA to operate on the resulting y5 layer and the new supplement layer y6. After that, a DRC check on the results is performed before deriving the results to form layer y7. At this point, the results are moved from layer y5 to layer y7. To make it able to loop, it deletes all the y5 geometries and changes all y7 geometries back to y5 so that the results can be reinput into the same procedure—FixDrcError, which uses y5 as its input layer, y6 as its supplement layer and y7 as its output layer. The last part of the procedure is for making a decision, assuming that it is clean, then checking to see if there is any error. If no error exists, the loop will be broken by the flag "error", otherwise, the program goes to a new loop.

While DIVA is executing, the elapsed time in which the program spends in a program loop is compared to a predetermined threshold, in a manner understood by those of ordinary skill in the art, as illustrated at block 304. If the time in which the program spends within the loop is acceptable, the results are checked for DRC errors, as illustrated at block 308. If no design rule check errors are present, the SKILL program post processes the final results which are free of design rule check errors, as illustrated at block 316 of FIG. 3. If, at block 308, design rule check errors are contained within the results, the SKILL program analyzes the design rule check errors and post processes the preliminary results from the last execution of the DIVA program, as illustrated at block 310. Next, the SKILL program creates the necessary supplemental geometries in preparation to correct the identified DRC errors, also as illustrated at block 310.

Next, a subsequent DIVA rules file is created to process the supplemental geometries created to fix the errors within the preliminary results, as illustrated by block 312.

Next, the DIVA program is executed to produce new results, also as illustrated at block 312. Next, the SKILL program performs any necessary post-processing for looping, as illustrated at block 314 and program flow returns to the threshold inquiry of block 304, as illustrated. The process repeats as described with reference to blocks 304 through 314 until the most recent set of results are free of DRC errors, at which point process flow will proceed to block 316, as previously described. If at decisional block 304, the elapsed time (or loop count) in a processing loop exceeded a predetermined threshold, the loop process ends with an error and a special processing of the final errors is performed by the SKILL program to eliminate any remaining DRC errors, as illustrated at block 306.

Utilizing the process illustrated herein, for a specific task, a SKILL program may be used to automatically and continuously run the DIVA DRC utility to generate intermediate results which are then further processed by the SKILL program in a feedback loop type manner until the final results are free of design rule check errors. A specific example of the above-described process is set forth below.

A software implementation of the above described embodiment(s) may comprise a series of computer instructions either fixed on a tangible medium, such as a computer readable media, e.g. diskette 142, CD-ROM 147, ROM 115, or fixed disk 152 of FIG. 1, or transmittable to a computer system, via a modem or other interface device, such as communications adapter 190 connected to the network 195 over a medium 191. Medium 191 can be either a tangible medium, including but not limited to optical or analog communications lines, or may be implemented with wireless techniques, including but not limited to microwave, infrared or other transmission techniques. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, preloaded with a computer system, e.g., on system ROM or fixed disk, or distributed from a server or electronic bulletin board over a network, e.g., the Internet or World Wide Web.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations which utilize a combination of hardware logic and software logic to achieve the same results. The invention, therefore, is not to be restricted except in the spirit of the appended claims.

What is claimed is:

1. A method for eliminating design rule check (DRC) errors detected by a design verification tool in a set of design data, the method comprising:

(a) creating a first rules file for a design verification tool, the first rules file being designed to attach a specific property type of specific error;

(b) processing a set of design data with the design verification tool to produce first verification results using the first rules file, the first verification results used as an input layer, the design data including geometric data describing an integrated circuit design to be verified;

(c) determining if the input layer contains a DRC error;

(d) if a DRC error is detected in the input layer, creating supplemental geometries responsive to the attached specific property to resolve the detected DRC error, the supplemental geometries used as a supplemental layer;

(e) creating a second rules file for the design verification tool for the supplemental layer;

(f) processing the input layer and the supplemental layer using the second rules file to produce second verification results to form an output layer; and (g) deleting all geometries from the input layer and changing all geometries in the output layer back to the input layer.

2. The method of claim 1 further comprising:

(i) further processing the error free design data if no errors are detected in the design verification results.

3. The method of claim 1 wherein said (f) processing includes:

performing DRC check on the second verification results before deriving the output layer.

4. The method of claim 1, further comprising:

(h) repeating (c) through (g) until no DRC errors are found in the design verification results.

5. A program storage device readable by a machine, tangibly embodying a program of instructions executable by the machine to perform a method for eliminating design rule check (DRC) errors detected by a design verification tool in a set of design data, the method comprising:

(a) creating a first rules file for a design verification tool, the first rules file being designed to attach a specific property type of specific error;

(b) processing a set of design data with the design verification tool to produce first verification results using the first rules file, the first verification results used as an input layer, the design data including geometric data describing an integrated circuit design to be verified;

(c) determining if the input layer contains a DRC error;

(d) if a DRC error is detected in the input layer, creating supplemental geometries responsive to the attached specific property to resolve the detected DRC error, the supplemental geometries used as a supplemental layer;

(e) creating a second rules file for the design verification tool for the supplemental layer;

(f) processing the input layer and the supplemental layer using the second rules file to produce second verification results to form an output layer; and (g) deleting all geometries from the input layer and changing all geometries in the output layer back to the input layer.

6. The program storage device of claim 5, wherein said (f) processing includes:

performing DRC check on the second verification results before deriving the output layer.

7. The program storage device of claim 5, wherein the method further includes:

(h) repeating (c) through (g) until no DRC errors are found in the design verification results.

* * * * *